US012282420B2

(12) United States Patent
Antony et al.

(10) Patent No.: US 12,282,420 B2
(45) Date of Patent: Apr. 22, 2025

(54) PROGRAMMATICAL ERRORS FROM ENGINEERING PROGRAMS IN A TECHNICAL INSTALLATION

(71) Applicant: Siemens Aktiengesellschaft, Munich (DE)

(72) Inventors: Elvis Antony, Nuremberg (DE); Srivathsa Simha Oruganti, Karnataka (IN)

(73) Assignee: Siemens Aktiengesellschaft, Munich (DE)

( * ) Notice: Subject to any disclaimer, the term of this patent is extended or adjusted under 35 U.S.C. 154(b) by 155 days.

(21) Appl. No.: 18/122,779

(22) Filed: Mar. 17, 2023

(65) Prior Publication Data

US 2023/0315613 A1 Oct. 5, 2023

(30) Foreign Application Priority Data

Mar. 31, 2022 (EP) .................................... 22166159

(51) Int. Cl.
| | |
|---|---|
| *G06F 9/44* | (2018.01) |
| *G06F 11/36* | (2006.01) |
| *G06F 11/3604* | (2025.01) |
| *G06F 11/3668* | (2025.01) |
| *G06N 5/022* | (2023.01) |

(52) U.S. Cl.
CPC ...... *G06F 11/3664* (2013.01); *G06F 11/3608* (2013.01); *G06F 11/3692* (2013.01); *G06N 5/022* (2013.01)

(58) Field of Classification Search
None
See application file for complete search history.

(56) References Cited

U.S. PATENT DOCUMENTS

| | | | | |
|---|---|---|---|---|
| 10,949,338 | B1* | 3/2021 | Sirianni | G06N 20/10 |
| 11,237,855 | B2* | 2/2022 | Kobayashi | G05B 19/0426 |
| 2017/0212829 | A1* | 7/2017 | Bales | G06F 11/3604 |
| 2018/0300227 | A1* | 10/2018 | Bergen | G06F 11/079 |
| 2022/0083926 | A1 | 3/2022 | Miller et al. | |
| 2023/0275897 | A1* | 8/2023 | Briant | H04L 63/083 |
| | | | | 726/5 |

OTHER PUBLICATIONS

JP2020052812, English translation (Year: 2020).*

* cited by examiner

*Primary Examiner* — Insun Kang
(74) *Attorney, Agent, or Firm* — Schmeiser, Olsen & Watts, LLP

(57) ABSTRACT

A method and system for eradicating programmatical errors in engineering programs for a controller device is provided. The method includes capturing, by a processing unit, a plurality of input-output signals associated with a controller device. Further, the method includes simulating, by the processing unit, a plurality of input signals which are predicted to be received by the controller device during a future scan cycle of execution of the engineering program. The method further includes predicting an error state in the controller device in the future scan cycle, by execution of the engineering program in a digital twin of the controller device. The method further includes generating corrected engineering program by application of an Artificial intelligence model on the engineering program.

11 Claims, 12 Drawing Sheets

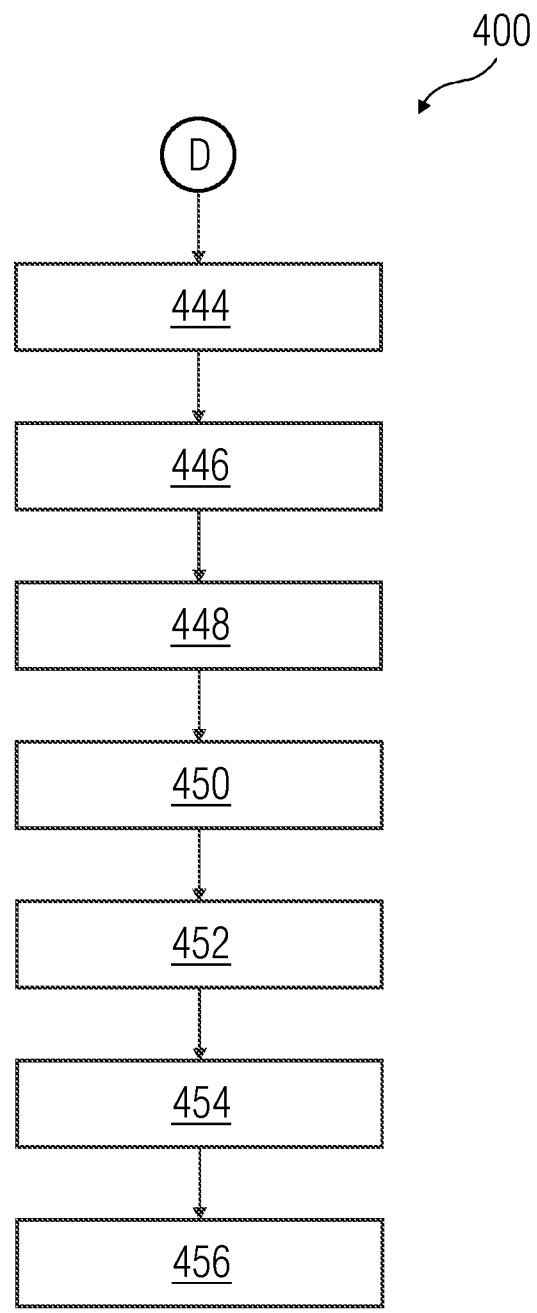

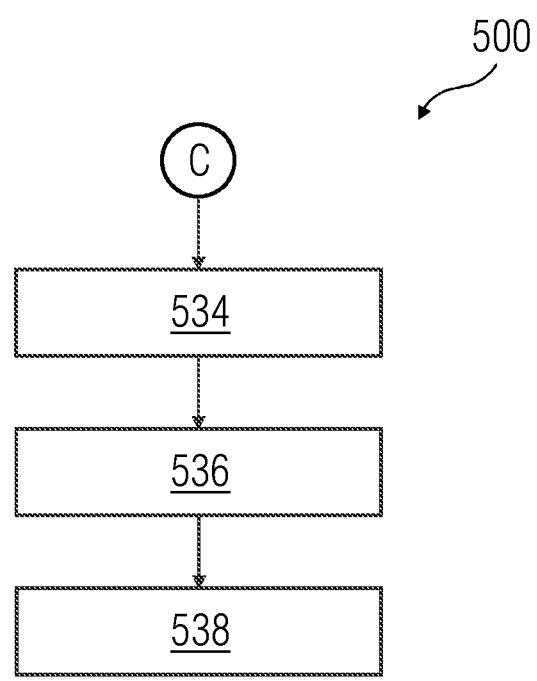

PROGRAMMATICAL ERRORS FROM ENGINEERING PROGRAMS IN A TECHNICAL INSTALLATION

CROSS-REFERENCE TO RELATED APPLICATIONS

This application claims priority to EP Application No. 22166159.8, having a filing date of Mar. 31, 2022, the entire contents of which are hereby incorporated by reference.

FIELD OF TECHNOLOGY

The following relates to a field of engineering of computer assisted programming, and more particularly relates to a method and system for eradicating programmatical errors from engineering programs.

BACKGROUND

A technical installation such as an industrial plant comprises one or more devices which are controlled by a controller device such as a programmable logical controller. Examples of the one or more devices includes but is not limited to, control valves, motors, pumps, and actuators. The controller device is configured to control the one or more devices by execution of an engineering program which may be stored in a memory. Sometimes, the engineering program contains a plurality of programmatical errors, execution of which, forces the controller device to an error state. In such a case, a proper functioning of the technical installation is halted, hence resulting in unplanned downtime. Thus, it is imperative to prevent a transition of the controller device into the error state.

To prevent such transitions to the error state, a code developer validates, debugs and proof-reads source code of the engineering program before its deployment. The code developer debugs the engineering program to eradicate any programmatical errors in the engineering program. However, the engineering programs used in the technical installations comprise a huge number of programming blocks, each of which are enormous in code length. The code developer may find it impossible to manually go through such gigantic blocks of code in order to detect and debug the programmatical errors. Furthermore, some of the programmatical errors may go unnoticed during validation and debugging by the code developers. Such programmatical errors may force the controller device into the error state and thus disrupt production cycles in the technical installation. When the controller device is forced into the error state, the code developer has to provide a resolution to the programmatical errors in the engineering program. Furthermore, the code developer has to check whether the resolution provided is correct or not. Checking whether the resolution provided is correct or not, is a time consuming and tedious task for the code developer.

Thus, if the code developer is not provided with automated assistance to eradicate the programmatical errors in the engineering program, a huge amount of labor and time may be wasted. Moreover, the code developer may find it impossible to complete code development in time.

In light of above, there exists a need for an efficient method and system for eradicating programmatical errors from engineering programs for a technical installation. Therefore, the present disclosure provides a method and system for eradicating programmatical errors from engineering programs for a technical installation.

SUMMARY

An aspect relates to a method of eradicating programmatical errors in an engineering program for a controller device. The controller device is a device which is configured to control one or more devices in a technical installation. Examples of the controller device comprises a programmable logical controller (PLC) or a microprocessor or a processing unit. Examples of the one or more devices include, but is not limited to control valves, motors, pumps, and actuators. Examples of the technical installation includes a manufacturing plant, a power plant, or a chemical processing plant. The controller device is configured to control the one or more devices based on an execution of the engineering program. The engineering program comprises a plurality of programming blocks, each of which comprises one or more programmatic errors. In one example, the engineering program is a graphical program comprising a program logic. The engineering program comprises a set of programmable instructions or statements corresponding to the program logic. Each programming block of the plurality of programming blocks corresponds to a function block under an engineering design of the technical installation. The engineering design may comprise several such programming blocks. The controller device is configured to execute the engineering program in a plurality of scan cycles.

In embodiments, the method further comprises capturing, by a processing unit, a plurality of input-output signals associated with a controller device. The plurality of input-output signals comprises a plurality of input signals and a plurality of output signals. Examples of the plurality of input signals comprises input signals received by the controller device from a plurality of sensors and a plurality of human machine interfaces, during the plurality of scan cycles of execution of the engineering program in the controller device. The plurality of output signals comprises output signals transmitted by the controller devices into the one or more devices in the technical installation during the plurality of scan cycles of execution of the engineering program by the controller device. In one example the plurality of input-output signals comprises signals which are transmitted or received by the controller device during a current scan cycle of execution of the engineering program in the controller device.

In embodiments, the method further comprises analyzing, by the processing unit, the plurality of input-output signals to generate an input knowledge graph, an output knowledge graph, and an input-output correspondence knowledge graph. The input knowledge graph comprises information about relationships between the input signals received by the controller device during the plurality of scan cycles of execution of the engineering program in the controller device. The processing unit is configured to query the input knowledge graph to predict input signals which are likely to be received by the controller device during a future scan cycle of execution of the engineering program in the controller device.

The output knowledge graph comprises information about relationships between the output signals transmitted by the controller device in the plurality of scan cycles of execution of the engineering program in the controller device. The processing unit is configured to query the output knowledge graph to predict output signals which are likely to be transmitted by the controller device at the future scan cycle of execution of the engineering program in the controller device. The input output correspondence knowledge graph comprises information about relationships between the input signals received by the controller device and the output signals transmitted by the controller device in the plurality of scan cycles of execution of the engineering program in the controller device. The processing unit is configured to query the output knowledge graph to predict an output signal which are likely to be transmitted by the controller device for a given input signal received by the controller device.

In embodiments, the method further comprises simulating, by the processing unit, a plurality of input signals which are predicted to be received by the controller device during a future scan cycle of execution of the engineering program in the controller device. The plurality of simulated input signals are simulated based on an analysis of the captured plurality of input-output signals. In one example, the plurality of input signals are simulated by the processing unit by querying the input knowledge graph, the output knowledge graph and the input-output knowledge graph generated from the captured plurality of input-output signals. The plurality of input signals are simulated based on analysis of input signals received by the controller device 124 during previous scan cycles. Furthermore, the plurality of input signals are simulated based on an analysis of information associated with relationship between each input signal in the captured plurality of input-output signals. Thus, the simulated plurality of input signals are likely to be received by the controller device during subsequent scan cycles of execution of the engineering program.

In embodiments, the method further comprises receiving, by the processing unit, a first set of program execution parameters from the controller device. The first set of program execution parameters comprises information about internal functioning of the controller device, during execution of the engineering program in the controller device. For example, the first set of program execution parameters comprises runtime information such as information about memory fragmentation, scan cycle nature, system resource utilization, and memory utilization of the controller device during a current scan cycle of execution of the engineering program in the controller device.

In embodiments, the method further comprises analyzing, by the processing unit, the captured plurality of input-output signals, the engineering program and the first set of program execution parameters of the controller device. The engineering program comprise a plurality of programming blocks. Each of the first set of program execution varies during each scan cycle of execution of the engineering program. The method further comprises determining, by the processing unit, a plurality of variations in the first set of program execution parameters when the controller device executes the engineering program in each scan cycle of the plurality of scan cycles.

In embodiments, the method further comprises generating, by the processing unit, a dynamic ontology-based knowledge graph based on the analysis. The dynamic ontology-based knowledge graph comprises relationship between the plurality of programming blocks of the engineering program, and the first set of program execution parameters of the controller device. The dynamic ontology-based knowledge graph further comprises information about relationship between variations in the first set of program execution parameters and the captured plurality of input-output signals.

In one example, the first set of program execution parameters comprises information about the plurality of scan cycles of execution of the engineering program. In such a case, the dynamic ontology-based knowledge graph comprises a scan cycle ontology. The scan cycle ontology comprises information about time taken for complete execution of the engineering program in each scan cycle in the plurality of scan cycles. The scan cycle ontology further comprises information about a total number of programming blocks scanned during each scan cycle of the plurality of scan cycles. The scan cycle ontology further comprises information about a total number of broken/unsuccessful scan cycles in the plurality of scan cycles.

The first set of program execution parameters further comprises information about resource utilization, and information about memory fragmentation. In such a case, the static ontology-based knowledge graph comprises information about memory fragmentation ontology and system resource utilization ontology. Examples of information in the system resource utilization ontology includes, but is not limited to, information related to frequency of system function calls. Examples of information in the memory fragmentation ontology includes, but is not limited to, information related to work memory utilization and load memory utilization in the controller device.

In embodiments, the method further comprises receiving from the controller device, by the processing unit, information associated with hardware configuration of the controller device. Information associated with the hardware configuration of the controller device comprises information about firmware, input/output instruction set, memory resources, processing power resources, clock speed, a model number and manufacturer details of the controller device. The method further comprises analyzing, by the processing unit, information associated with the hardware configuration of the controller device. The method further comprises generating, by the processing unit, a static ontology-based knowledge graph based on the analysis of the information about the hardware configuration. The static ontology-based knowledge graph comprises information about the one or more hardware configuration related information associated with the controller device. The method further comprises, generating, by the processing unit, a hardware ontology for the controller device based on the static ontology-based knowledge graph and the dynamic ontology based knowledge graph. The hardware ontology of the controller device comprises a two-dimensional knowledge graph comprising the static ontology based knowledge graph and the dynamic ontology based knowledge graph.

In one example, the method further comprises receiving, by the processing unit, a plurality of program execution parameters of the controller device during execution of each programming block of the engineering program in a plurality of scan cycles. The method further comprises analyzing, by the processing unit, the plurality of program execution parameters of the controller device during execution of each of the plurality of scan cycles. The method further comprises determining, by the processing unit, from the plurality of scan cycles, a set of successful scan cycles and a set of unsuccessful scan cycles. The set of successful scan cycles and the set of unsuccessful scan cycles are determined based on the analysis of the received plurality of program execution parameters. In such a case, the method further comprises generating, by the processing unit, a hardware ontology-based knowledge graph based on an analysis of information associated with the set of successful scan cycles and the set of unsuccessful scan cycles.

In embodiments, the method further comprises generating, by the processing unit, a digital twin for the controller device based on the analysis of the hardware ontology of the controller device. In one example, the digital twin of the controller device is generated based on an analysis of the dynamic ontology-based knowledge graph and the static ontology-based knowledge graph. The digital twin is generated further based on the input knowledge graph, the output knowledge graph, and the input-output correspondence knowledge graph generated by the processing unit. In one example, the digital twin of the controller device is a simulation model of the controller device, which is configured to simulate outputs which is likely to be generated by the controller device, when the controller device executes the engineering program in the plurality of scan cycles. The digital twin is generated using a combination of the dynamic ontology-based knowledge graph and the static ontology-based knowledge graph. The dynamic ontology-based knowledge graph maps changes in internal functioning of the controller device to different programming blocks of the engineering program. Thus, the generated digital twin accurately simulates execution of the engineering program by the controller device.

In embodiments, the method further comprises executing, by the processing unit, the engineering program in the generated digital twin, using the simulated plurality of input signals as input. In other words, the processing unit causes the digital twin to simulate an execution of the engineering program by the controller device, as if the simulated plurality of input signals are fed to the controller device during execution of the engineering program.

In embodiments, the method further comprises receiving, by the processing unit, from the digital twin of the controller device, one or more program execution parameters, during execution of the engineering program by the digital twin. The method further comprises analyzing the one or more program execution parameters received from the digital twin. The method further comprises detecting, by the processing unit, an occurrence of an error state in the digital twin during a specific scan cycle of execution of the engineering program. The method further comprises predicting, by the processing unit, an occurrence of an error state in the controller device based on execution of the engineering program in the digital twin of the controller device. The error state is predicted to occur in the controller device at a future scan cycle of execution of the engineering program by the controller device. It has been noted that the simulated plurality of input signals comprises input signals which are likely to be received by the controller device at the future scan cycle of execution of the engineering program. Further, the digital twin of the controller device simulates behavior of the controller device. Thus, execution of the engineering program in the digital twin enables accurate prediction of the error state in the controller device at the future scan cycle. Thus, a user is enabled to modify the engineering program to avoid such error states during execution of the engineering program in the controller device.

In embodiments, the method further comprises, analyzing, by the processing unit, the engineering program and the predicted error state of the controller device. The method further comprises determining, by the processing unit, one or more programmatical errors in the engineering program based on an analysis of the predicted error state in the controller device. Examples of the one or more programmatical errors includes, but is not limited to syntax errors, semantic errors, logical errors, interface errors, and resource errors. In one example, the method comprises mapping, by the processing unit, the predicted error state to one or more programming blocks of the engineering program. Further, the method comprises determining, by the processing unit, a type of the predicted error state based on an analysis of the predicted error state. Examples of the type of the one or more programmatical errors includes, but is not limited to a syntax error type, a semantic error type, a logical error type, an interface error type, and a resource error type. In embodiments, the method further comprises determining, by the processing unit, one or more programmatical errors in the engineering program based on an analysis of the predicted error state. In one example, the one or more programmatical errors are determined based on an application of an artificial intelligence model on the predicted error state and the engineering program. In one example, the artificial intelligence model is a convoluted neural network based artificial intelligence model. In another example, the one or more programmatical errors are determined based on the mapping of the predicted error state to the one or more programming blocks of the engineering program.

In embodiments, the method comprises, applying, by the processing unit, the artificial intelligence model on the engineering program to eradicate the determined one or more programmatical errors from the engineering program. In embodiments, the method further comprises generating, by the processing unit, a corrected engineering program based on the application of the artificial intelligence model on the engineering program. The artificial intelligence model is trained to eradicate the determined one or more programmatical errors from the engineering program.

In embodiments, the artificial intelligence model is trained to eradicate the one or more programmatical errors by initiating, by the processing unit, concurrent execution of the engineering program, in the controller device and the digital twin. The concurrent execution is performed using input signals from the captured plurality of input-output signals. In other words, the controller device and the digital twin of the controller device executes the engineering program simultaneously. In embodiments, the method further comprises receiving, by the processing unit, the first set of program execution parameters from the controller device. In embodiments, the method further comprises analyzing, by the processing unit, the first set of program execution parameters. In embodiments, the method further comprises determining, by the processing unit, that the controller device in the error state based on an analysis of the plurality of program execution parameters. In one example, the processing unit is configured to determine the error state by detecting one or more abnormal values in the first set of program execution parameters. In one example, the first set of program execution parameters comprise information about memory resource consumption percentage associated with the controller device. The memory resource consumption percentage comprises information about a percentage of internal memory utilized by the controller device during each scan cycle of execution of the engineering program. In such a case, the processing unit is configured to determine that the controller device is in the error state, when the memory resource utilization percentage reaches 100 percent.

In embodiments, the artificial intelligence model is trained furthermore by determining, by the processing unit, a set of programmatical errors in each programming block of the engineering program based on an analysis of the error state. The set of programmatical errors in each programming block is determined by the processing unit, by analyzing variations in the first set of program execution parameters while the controller device executes of the respective programming block of the engineering program. In embodiments, the method further comprises generating, by the processing unit, a cause ontology-based knowledge graph based on an analysis of the determined set of programmatical errors, the received first set of program execution parameters, and the plurality of programming blocks of the engineering program. The cause ontology-based knowledge graph comprises information about a relationship between the set of programmatical errors in the engineering program and the error state of the controller device. In other words, the cause ontology-based knowledge graph comprises information about the set of programmatical errors in the engineering program and a type of the error state caused by each of the set of programmatical errors. In embodiments, the method further comprises analyzing, by the processing unit, the generated use ontology-based knowledge graph to train the artificial intelligence model to determine the one or more programmatical errors which causes the error state in the controller device.

In embodiments, the method further comprises displaying, by the processing unit, information associated with the set of programmatical errors via a display device. Examples of the display device includes but is not limited to a human machine interface such as a liquid crystal display screen. In embodiments, the method further comprises receiving, by the processing unit, a plurality of modifications to the engineering program, from the user. The user may enter the plurality of modifications to the engineering program via the human machine interface such as a keyboard or a mouse. The user may enter the plurality of modifications to eliminate the determined set of programmatical errors in the engineering program. In embodiments, the method further comprises modifying, by the processing unit, the engineering program by applying the received plurality of modifications in the engineering program, to generate a modified engineering program.

In embodiments, the method further comprises initiating, by the processing unit, simultaneous execution of the modified engineering program in the controller device and the digital twin of the controller device. The captured plurality of input-output signals is fed as input into the controller device and digital twin during the execution of the modified engineering program. In embodiments, the method further comprises receiving, by the processing unit, a second set of program execution parameters from the controller device and the digital twin. The second set of program execution parameters comprises information about internal functioning of the controller device and the digital twin, during execution of the modified engineering program in the controller device and the digital twin of the controller device. In embodiments, the method further comprises comparing, by the processing unit, the first set of program execution parameters with the second set of program execution parameters.

In embodiments, the method further comprises determining, by the processing unit, an improvement in the second set of program execution parameters as compared with the first set of program execution parameters. In one example, the memory resource utilization percentage of the second set of program execution parameters may be lesser than the memory resource utilization percentage of the first set of program execution parameters, for execution of a corresponding portion of the engineering program and the modified engineering program. In such a case, the processing unit is configured to determine that the second set of program execution parameters has improved as compared to the first set of program execution parameters. In embodiments, the method further comprises generating, by the processing unit, a resolution ontology-based knowledge graph based on an analysis of the determined set of programmatical errors, the received plurality of modifications, the first set of program execution parameters and the second set of program execution parameters. The resolution ontology-based knowledge graph comprises information about relationship between the determined set of programmatical errors and the plurality of modifications performed by the user to eradicate the determined set of programmatical errors from the engineering program.

In embodiments, the method further comprises generating, by the processing unit, an effect ontology-based knowledge graph based on the plurality of modifications and a result of the comparison between the first set of program execution parameters and the second set of program execution parameters. In embodiments, the method further comprises training, by the processing unit, the artificial intelligence model to determine and eradicate the one or more programmatical errors from the engineering program, using the cause ontology-based knowledge graph, the resolution ontology based knowledge graph, and the effect ontology based knowledge graph.

In embodiments, the method further comprises displaying, by the processing unit, the corrected engineering program to the user via the display device. In embodiments, the method further comprises receiving, by the processing unit, a plurality of review comments about the corrected engineering program, from the user. In embodiments, the method further comprises determining, by the processing unit, a set of modifications for the corrected engineering program, based on an analysis of the plurality of review comments. In embodiments, the method further comprises retraining, by the processing unit, the artificial intelligence model based on the determined set of modifications In embodiments, the method further comprises initiating, by the processing unit, a concurrent execution of the engineering program in the controller device and the digital twin, using from the captured plurality of input-output signals as input. In embodiments, the method further comprises receiving, by the processing unit, a first set of output signals from the controller device, and a second set of output signals from the digital twin. In embodiments, the method further comprises comparing, by the processing unit, the first set of output signals and the second set of output signals. In embodiments, the method further comprises determining, by the processing unit, a plurality of differences between the first set of output signals and the second set of output signals, based on the comparison. In embodiments, the method further comprises determining, by the processing unit, the one or more programmatical errors in the engineering program based on an analysis of the plurality of differences. In embodiments, the method further comprises generating, by the processing unit, the corrected engineering program by application of the Artificial intelligence model on the engineering program. It is noted that the Artificial intelligence model is trained to eradicate the determined one or more programmatical errors from the engineering program.

The present disclosure provides by an engineering system for eradicating programmatical errors from engineering programs. The engineering system comprises one or more processor(s) and a memory coupled to the processor. The memory comprises a diagnostics and resolution module stored in the form of machine-readable instructions executable by the processor. The diagnostics and resolution module are configured for performing the method as described above.

The present disclosure provides an industrial environment. The industrial environment comprising an engineering system, a technical installation comprising one or more physical components and one or more client devices communicatively coupled to the engineering system and the technical installation. The engineering system is configured to perform the above-described method steps.

The present disclosure provides a computer-program product having machine-readable instructions stored therein, that when executed by one or more processor(s), cause the one or more processor(s) to perform method steps as described above.

The above-mentioned and other features of embodiments of the invention will now be addressed with reference to the accompanying drawings of the present disclosure. The illustrated embodiments are intended to illustrate, but not limit the invention.

BRIEF DESCRIPTION

Some of the embodiments will be described in detail, with reference to the following figures, wherein like designations denote like members, wherein:

FIG. 4E is a process flowchart illustrating an exemplary method of generating engineering programs in an engineering system, according to an embodiment of the present disclosure;

FIG. 5D is a process flowchart illustrating an exemplary method of training an artificial intelligence model to eradicate programmatical errors in the engineering program.

DETAILED DESCRIPTION

In the following description, for the purpose of explanation, numerous specific details are set forth in order to provide thorough understanding of one or more embodiments. It may be evident that such embodiments may be practiced without these specific details.

Figure 1:
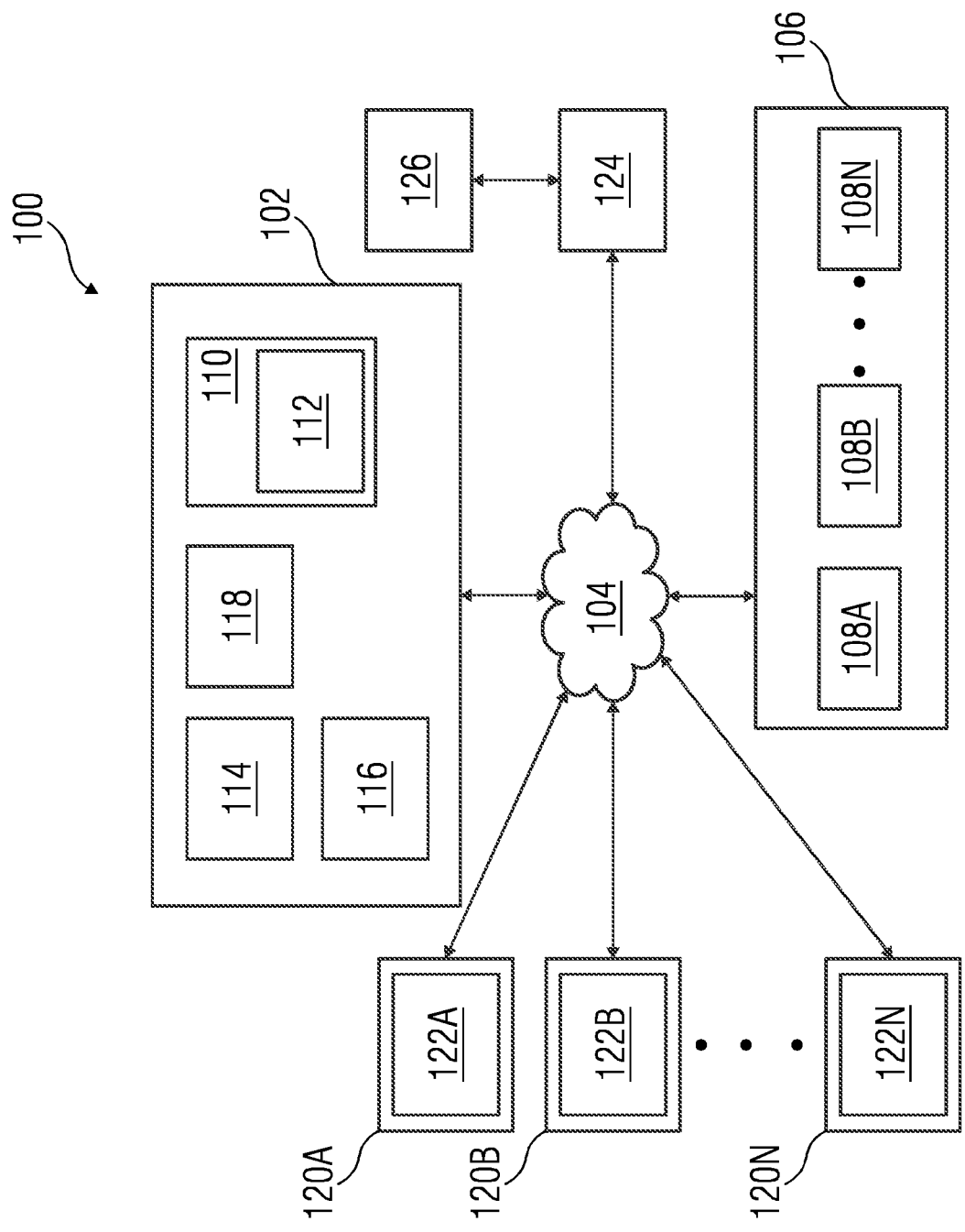
FIG. 1 is a block diagram of an industrial environment capable of eradicating programmatical errors from an engineering program, according to an embodiment of the present disclosure.

FIG. 1 is a block diagram of an industrial environment 100 capable of eradicating programmatical errors from an engineering program, according to an embodiment of the present disclosure. In FIG. 1, the industrial environment 100 includes an engineering system 102, a technical installation 106 and one or more client devices 120A-N. As used herein, "industrial environment" refers to a processing environment comprising configurable computing physical and logical resources, for example, networks, servers, storage, applications, services, etc., and data distributed over a platform, such as cloud computing platform. The industrial environment 100 provides on-demand network access to a shared pool of the configurable computing physical and logical resources. The engineering system 102 is communicatively connected to the technical installation 106 via the network 104 (such as Local Area Network (LAN), Wide Area Network (WAN), Wi-Fi, Internet, any short range or wide range communication). The engineering system 102 is also connected to the one or more client devices 120A-N via the network 104.

The engineering system 102 is connected to one or more engineering objects 108A-N in the technical installation 106 via the network 104. The one or more engineering objects 108A-N may include servers, robots, switches, automation devices, programmable logic controllers (PLC)s, human machine interfaces (HMIs), motors, valves, pumps, actuators, sensors and other industrial equipment(s). The one or more engineering objects 108A-N may be connected to each other or several other components (not shown in FIG. 1) via physical connections. The physical connections may be through wiring between the one or more engineering objects 108A-N. Alternatively, the one or more engineering objects 108A-N may also be connected via non-physical connections (such as Internet of Things (IoT)) and 5G networks. Although FIG. 1 illustrates the engineering system 102 connected to one technical installation 106, one skilled in the conventional art can envision that the engineering system 102 can be connected to several technical installations 106 located at different geographical locations via the network 104.

The client devices 120A-N may be a desktop computer, laptop computer, tablet, smart phone and the like. Each of the client devices 120A-N is provided with an engineering tool 122A-N for generating and/or editing engineering programs respectively. The client devices 120A-N can access the engineering system 102 for automatically generating engineering programs. The client devices 120A-N can access cloud applications (such as providing performance visualization of the one or more engineering objects 108A-N via a web browser). Throughout the specification, the terms "client device" and "user device" are used interchangeably.

The engineering system 102 is further connected to a controller device 124. Examples of the controller device 124 comprises, but is not limited to programmable logic controllers, microprocessors, and other processing units. The controller device 124 is configured to execute the engineering program generated by the engineering system, in a plurality of scan cycles. The controller device 112 is configured to receive a plurality of input signals from a plurality of sensors and a plurality of human machine interfaces such as the one or more client devices 120A-N. The controller device 112 is further configured to transmit a plurality of output signals to the one or more engineering objects 108A-N.

The engineering system 102 may be a standalone server deployed at a control station or may be a remote server on a cloud computing platform. In embodiments, the engineering system 102 may be a cloud-based engineering system. The engineering system 102 is capable of delivering applications (such as cloud applications) for managing a technical installation 106 comprising one or more engineering objects 108A-N. The engineering system 102 may comprise a platform 110 (such as a cloud computing platform), an diagnostics and resolution module 112, a server 114 including hardware resources and an operating system (OS), a network interface 116 and a database 118. The network interface 116 enables communication between the engineering system 102, the technical installation 106, the client device(s) 120A-N, and the controller device 124. The interface (such as cloud interface) (not shown in FIG. 1) may allow the engineers at the one or more client device(s) 120A-N to access engineering project files stored at the engineering system 102 and perform one or more actions on the engineering project files as same instance. The server 114 may include one or more servers on which the OS is installed. The servers 114 may comprise one or more processors, one or more storage devices, such as, memory units, for storing data and machine-readable instructions for example, applications and application programming interfaces (APIs), and other peripherals required for providing computing (such as cloud computing) functionality. The platform 110 enables functionalities such as data reception, data processing, data rendering, data communication, etc. using the hardware resources and the OS of the servers 114 and delivers the aforementioned services using the application programming interfaces deployed therein. The platform 110 may comprise a combination of dedicated hardware and software built on top of the hardware and the OS. In an exemplary embodiment, the platform 110 may correspond to an Integrated Development Environment (IDE) comprising program editors and compilers which allow the users of the client devices 120A-N to generate engineering programs. The platform 110 may further comprise a diagnostic and resolution module 112 configured for generating engineering programs. In one example, the diagnostic and resolution module 112 comprises a digital twin 126 of the controller device 124. Details of the diagnostic and resolution module 112 is explained in FIG. 3.

The database 118 stores the information relating to the technical installation 106 and the client device(s) 120A-N. The database 118 is, for example, a structured query language (SQL) data store or a not only SQL (NoSQL) data store. In an exemplary embodiment, the database 118 may be configured as cloud-based database implemented in the industrial environment 100, where computing resources are delivered as a service over the platform 110. The database 118, according to another embodiment of the present disclosure, is a location on a file system directly accessible by the diagnostic and resolution module 112. The database 118 is configured to store engineering project files, engineering programs, object behavior model, parameter values associated with the one or more engineering objects 108A-N, test results, simulation results, status messages, one or more simulation instances, graphical programs, program logics, program logic patterns, engineering objects 108A-N and engineering object properties, one or more engineering object blocks, relationship information between the engineering objects, requirements, program update messages and the like.

In an exemplary embodiment of the present disclosure, the controller device 124 is configured to execute the engineering program to control the one or more engineering objects 108A-N. To control the one or more engineering objects 108A-N, the controller device 124 is configured to generate a plurality of output signals based on the execution of the engineering program. The diagnostic and resolution module 112 runs parallel to the execution of the engineering program. The diagnostic and resolution module 112 is configured to detect and eradicate one or more programmatical errors from the engineering program during runtime. Thus diagnostic and resolution module 112 prevents the controller device 124 from entering into an error state. The one or more programmatical errors comprises syntactic, and semantic errors.

The diagnostic and resolution module 112 is configured to capture a plurality of input-output signals associated with a controller device 124. The plurality of input-output signals comprises a plurality of input signals and a plurality of output signals. Examples of the plurality of input signals comprises input signals received by the controller device 124 from a plurality of sensors and a plurality of human machine interfaces, during the plurality of scan cycles of execution of the engineering program in the controller device 124. The plurality of output signals comprises output signals transmitted by the controller device 124 into the one or more devices in the technical installation 106 during the plurality of scan cycles of execution of the engineering program by the controller device 124. In one example the plurality of input-output signals comprises signals which are transmitted or received by the controller device 124 during a current scan cycle of execution of the engineering program in the controller device 124.

The diagnostic and resolution module 112 is further configured to analyze the plurality of input-output signals to generate an input knowledge graph, an output knowledge graph, and an input-output correspondence knowledge graph. The input knowledge graph comprises information about relationships between the input signals received by the controller device 124 during the plurality of scan cycles of execution of the engineering program in the controller device 124. The diagnostic and resolution module 112 is further configured to query the input knowledge graph to predict input signals which are likely to be received by the controller device 124 during a future scan cycle of execution of the engineering program in the controller device 124.

The output knowledge graph comprises information about relationships between the output signals transmitted by the controller device 124 in the plurality of scan cycles of execution of the engineering program in the controller device 124. The diagnostic and resolution module 112 is further configured to query the output knowledge graph to predict output signals which are likely to be transmitted by the controller device 124 at the future scan cycle of execution of the engineering program in the controller device 124. The input output correspondence knowledge graph comprises information about relationships between the input signals received by and the output signals transmitted by the controller device 124 in the plurality of scan cycles of execution of the engineering program in the controller device 124. The processing unit 202 is configured to query the output knowledge graph to predict an output signal which are likely to be transmitted by the controller device 124 for a given input signal received by the controller device 124.

The diagnostic and resolution module 112 is further configured to simulate a plurality of input signals which are predicted to be received by the controller device 124 during a future scan cycle of execution of the engineering program.

The plurality of simulated input signals is simulated based on an analysis of the captured plurality of input-output signals.

The diagnostic and resolution module 112 is further configured to receive a first set of program execution parameters from the controller device 124. The first set of program execution parameters comprises information about internal functioning of the controller device 124, during execution of the engineering program in the current scan cycle. For example, the first set of program execution parameters comprises runtime information such as information about memory fragmentation, scan cycle nature, system resource utilization, and memory utilization of the controller device 124 during the current scan cycle of execution of the engineering program.

The diagnostic and resolution module 112 is further configured to analyze the captured plurality of input-output signals, the engineering program and the first set of program execution parameters of the controller device 124. The engineering program comprise a plurality of programming blocks. Each of the first set of program execution varies during each scan cycle of execution of the engineering program. The diagnostic and resolution module 112 is further configured to determine a plurality of variations in the first set of program execution parameters when the controller device 124 executes the engineering program in each scan cycle of the plurality of scan cycles.

The diagnostic and resolution module 112 is further configured to generate a dynamic ontology-based knowledge graph based on the analysis. The dynamic ontology-based knowledge graph comprises relationship between the plurality of programming blocks of the engineering program, and the first set of program execution parameters of the controller device 124. The dynamic ontology-based knowledge graph further comprises information about relationship between variations in the first set of program execution parameters and the captured plurality of input-output signals. In one example, the first set of program execution parameters comprises information about the plurality of scan cycles of execution of the engineering program. In such a case, the dynamic ontology-based knowledge graph comprises a scan cycle ontology. The scan cycle ontology comprises information about time taken for each scan cycle in the plurality of scan cycles. The scan cycle ontology further comprises information about a total number of programming blocks scanned during each scan cycle of the plurality of scan cycles. The scan cycle ontology further comprises information about a total number of broken/unsuccessful scan cycles in the plurality of scan cycles.

The first set of program execution parameters further comprises information about resource utilization, and information about memory fragmentation. In such a case, the static ontology-based knowledge graph comprises information about memory fragmentation ontology and system resource utilization ontology. Examples of information in the system resource utilization ontology includes, but is not limited to, information related to frequency of system function calls. Examples of information in the memory fragmentation ontology includes, but is not limited to, information related to work memory utilization and load memory utilization in the controller device 124.

The diagnostic and resolution module 112 is further configured to receive information associated with hardware configuration of the controller device 124. Information associated with the hardware configuration of the controller device 124 comprises information about firmware, input/output instruction set, memory resources, processing power resources, clock speed, a model number and a manufacturer details of the controller device 124. The diagnostic and resolution module 112 further causes the processing unit 202 to analyze information associated with the hardware configuration of the controller device 124. The diagnostic and resolution module 112 is further configured to generate a static ontology-based knowledge graph based on the analysis of the information about the hardware configuration. The static ontology-based knowledge graph comprises information about the one or more hardware configuration related information associated with the controller device 124.

The diagnostic and resolution module 112 is further configured to generate a hardware ontology for the controller device 124 based on the static ontology-based knowledge graph and the dynamic ontology based knowledge graph. The hardware ontology of the controller device 124 comprises a two-dimensional knowledge graph comprising the static ontology based knowledge graph and the dynamic ontology based knowledge graph.

The diagnostic and resolution module 112 is further configured to analyze the plurality of program execution parameters of the controller device 124 during execution of each of the plurality of scan cycles. The diagnostic and resolution module 112 is further configured to generate the digital twin 126 for the controller device 124 based on the analysis of the hardware ontology of the controller device 124. In one example, the digital twin 126 of the controller device 124 is generated based on an analysis of the dynamic ontology-based knowledge graph and the static ontology-based knowledge graph. The digital twin 126 is generated further based on the input knowledge graph, the output knowledge graph, and the input-output correspondence knowledge graph generated by the processing unit 202. In one example, the digital twin 126 of the controller device 124 is a computer model of the controller device 124, which is configured to simulate outputs which is likely to be generated by the controller device 124 in a future scan cycle of execution of the engineering program in the controller device 124.

The diagnostic and resolution module 112 is further configured to execute the engineering program in the generated digital twin 126, using the simulated plurality of input signals as input. In other words, the processing unit 202 causes the digital twin 126 to simulate an execution of the engineering program by the controller device 124, as if the simulated plurality of input signals are fed to the controller device 124 during execution of the engineering program.

The diagnostic and resolution module 112 is further configured to predict an occurrence of an error state in the controller device 124 based on execution of the engineering program in the digital twin 126 of the controller device 124. The error state occurs in the controller device 124 at the future scan cycle of execution of the engineering program by the controller device 124.

The diagnostic and resolution module 112 is further configured to determine the one or more programmatical errors in the engineering program based on an analysis of the predicted error state in the controller device 124. Examples of the one or more programmatical errors includes, but is not limited to syntax errors, semantic errors, logical errors, interface errors, and resource errors.

The diagnostic and resolution module 112 is further configured to generate a corrected engineering program based on the application of an artificial intelligence model on the engineering program. The artificial intelligence model is explained in detail with reference to FIG. 3.

Figure 2:
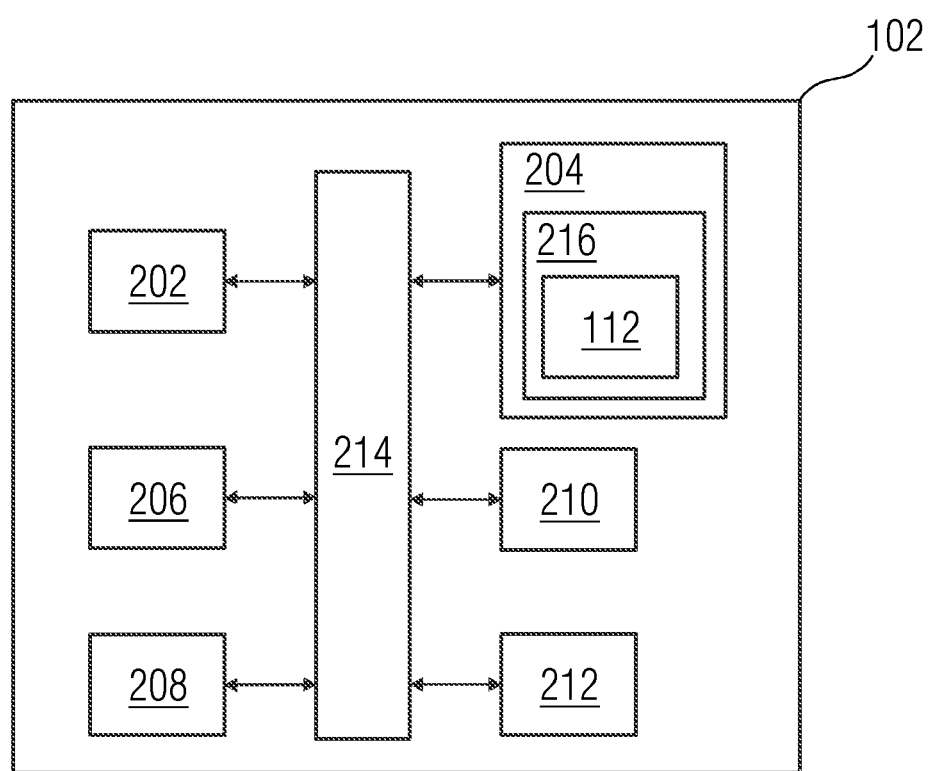
FIG. 2 is a block diagram of an engineering system, such as those shown in FIG. 1, in which an embodiment of the present disclosure can be implemented.

FIG. 2 is a block diagram of an engineering system 102, such as those shown in FIG. 1, in which an embodiment of the present disclosure can be implemented. In FIG. 2, the engineering system 102 includes a processing unit 202, an accessible memory 204, a storage unit 206, a communication interface 208, an input-output unit 210, a network interface 212 and a bus 214. The processing unit 202, as used herein, means any type of computational circuit, such as, but not limited to, a microprocessor unit, microcontroller, complex instruction set computing microprocessor unit, reduced instruction set computing microprocessor unit, very long instruction word microprocessor unit, explicitly parallel instruction computing microprocessor unit, graphics processing unit, digital signal processing unit, or any other type of processing circuit. The processing unit 202 may also include embedded controllers, such as generic or programmable logic devices or arrays, application specific integrated circuits, single-chip computers, and the like.

The memory 204 may be non-transitory volatile memory and non-volatile memory. The memory 204 may be coupled for communication with the processing unit 202, such as being a computer-readable storage medium. The processing unit 202 may execute machine-readable instructions and/or source code stored in the memory 204. A variety of machine-readable instructions may be stored in and accessed from the memory 204. The memory 204 may include any suitable elements for storing data and machine-readable instructions, such as read only memory, random access memory, erasable programmable read only memory, electrically erasable programmable read only memory, a hard drive, a removable media drive for handling compact disks, digital video disks, diskettes, magnetic tape cartridges, memory cards, and the like. In the present embodiment, the memory 204 includes an integrated development environment (IDE) 216. The IDE 216 includes the diagnostic and resolution module 112 stored in the form of machine-readable instructions on any of the above-mentioned storage media and may be in communication with and executed by the processor(s) 202.

When executed by the processing unit 202, the diagnostic and resolution module 112 causes the processing unit 202 to eradicate programmatical errors from the engineering program in the engineering system 102.

In one embodiment, the diagnostic and resolution module 112 causes the processing unit 202 to capture a plurality of input-output signals associated with a controller device 124. The plurality of input-output signals comprises a plurality of input signals and a plurality of output signals. Examples of the plurality of input signals comprises input signals received by the controller device 124 from a plurality of sensors and a plurality of human machine interfaces, during the plurality of scan cycles of execution of the engineering program in the controller device 124. The plurality of output signals comprises output signals transmitted by the controller device 124 into the one or more devices in the technical installation 106 during the plurality of scan cycles of execution of the engineering program by the controller device 124. In one example the plurality of input-output signals comprises signals which are transmitted or received by the controller device 124 during a current scan cycle of execution of the engineering program in the controller device 124.

The diagnostic and resolution module 112 further causes the processing unit 202 to analyze the plurality of input-output signals to generate an input knowledge graph, an output knowledge graph, and an input-output correspondence knowledge graph. The input knowledge graph comprises information about relationships between the input signals received by the controller device 124 during the plurality of scan cycles of execution of the engineering program in the controller device 124. The processing unit 202 is configured to query the input knowledge graph to predict input signals which are likely to be received by the controller device 124 during a future scan cycle of execution of the engineering program in the controller device 124.

The output knowledge graph comprises information about relationships between the output signals transmitted by the controller device 124 in the plurality of scan cycles of execution of the engineering program in the controller device 124. The processing unit 202 is configured to query the output knowledge graph to predict output signals which are likely to be transmitted by the controller device 124 at the future scan cycle of execution of the engineering program in the controller device 124. The input output correspondence knowledge graph comprises information about relationships between the input signals received by and the output signals transmitted by the controller device 124 in the plurality of scan cycles of execution of the engineering program in the controller device 124. The processing unit 202 is configured to query the output knowledge graph to predict an output signal which are likely to be transmitted by the controller device 124 for a given input signal received by the controller device 124.

The diagnostic and resolution module 112 further causes the processing unit 202 to simulate a plurality of input signals which are predicted to be received by the controller device 124 during a future scan cycle of execution of the engineering program. The plurality of simulated input signals is simulated based on an analysis of the captured plurality of input-output signals. In one example, the plurality of input signals are simulated by the processing unit 202 by querying the input knowledge graph, the output knowledge graph and the input-output knowledge graph generated from the captured plurality of input-output signals.

The diagnostic and resolution module 112 further causes the processing unit 202 to receive a first set of program execution parameters from the controller device 124. The first set of program execution parameters comprises information about internal functioning of the controller device 124, during execution of the engineering program in the current scan cycle. For example, the first set of program execution parameters comprises runtime information such as information about memory fragmentation, scan cycle nature, system resource utilization, and memory utilization of the controller device 124 during the current scan cycle of execution of the engineering program.

The diagnostic and resolution module 112 further causes the processing unit 202 to analyze the captured plurality of input-output signals, the engineering program and the first set of program execution parameters of the controller device 124. The engineering program comprise a plurality of programming blocks. Each of the first set of program execution varies during each scan cycle of execution of the engineering program. The diagnostic and resolution module 112 further causes the processing unit 202 to determine a plurality of variations in the first set of program execution parameters when the controller device 124 executes the engineering program in each scan cycle of the plurality of scan cycles.

The diagnostic and resolution module 112 further causes the processing unit 202 to generate a dynamic ontology-based knowledge graph based on the analysis. The dynamic ontology-based knowledge graph comprises relationship between the plurality of programming blocks of the engineering program, and the first set of program execution parameters of the controller device 124. The dynamic ontology-based knowledge graph further comprises information about relationship between variations in the first set of program execution parameters and the captured plurality of input-output signals. In one example, the first set of program execution parameters comprises information about the plurality of scan cycles of execution of the engineering program. In such a case, the dynamic ontology-based knowledge graph comprises a scan cycle ontology. The scan cycle ontology comprises information about time taken for each scan cycle in the plurality of scan cycles. The scan cycle ontology further comprises information about a total number of programming blocks scanned during each scan cycle of the plurality of scan cycles. The scan cycle ontology further comprises information about a total number of broken/unsuccessful scan cycles in the plurality of scan cycles.

The first set of program execution parameters further comprises information about resource utilization, and information about memory fragmentation. In such a case, the static ontology-based knowledge graph comprises information about memory fragmentation ontology and system resource utilization ontology. Examples of information in the system resource utilization ontology includes, but is not limited to, information related to frequency of system function calls. Examples of information in the memory fragmentation ontology includes, but is not limited to, information related to work memory utilization and load memory utilization in the controller device 124.

The diagnostic and resolution module 112 further causes the processing unit 202 to receive information associated with hardware configuration of the controller device 124. Information associated with the hardware configuration of the controller device 124 comprises information about firmware, input/output instruction set, memory resources, processing power resources, clock speed, a model number and a manufacturer details of the controller device 124. The diagnostic and resolution module 112 further causes the processing unit 202 to analyze information associated with the hardware configuration of the controller device 124. The diagnostic and resolution module 112 further causes the processing unit 202 to generate a static ontology-based knowledge graph based on the analysis of the information about the hardware configuration. The static ontology-based knowledge graph comprises information about the one or more hardware configuration related information associated with the controller device 124.

The diagnostic and resolution module 112 further causes the processing unit 202 to generate a hardware ontology for the controller device 124 based on the static ontology-based knowledge graph and the dynamic ontology based knowledge graph. The hardware ontology of the controller device 124 comprises a two-dimensional knowledge graph comprising the static ontology-based knowledge graph and the dynamic ontology-based knowledge graph.

The diagnostic and resolution module 112 further causes the processing unit 202 to receive a plurality of program execution parameters of the controller device 124 during execution of each programming block of the engineering program in a plurality of scan cycles.

The diagnostic and resolution module 112 further causes the processing unit 202 to analyze the plurality of program execution parameters of the controller device 124 during execution of each of the plurality of scan cycles. The diagnostic and resolution module 112 further causes the processing unit 202 to determine from the plurality of scan cycles, a set of successful scan cycles and a set of unsuccessful scan cycles. The set of successful scan cycles and the set of unsuccessful scan cycles are determined based on the analysis of the received plurality of program execution parameters. In such a case, the diagnostic and resolution module 112 further causes the processing unit 202 to generate a hardware ontology-based knowledge graph based on an analysis of information associated with the set of successful scan cycles and the set of unsuccessful scan cycles.

The diagnostic and resolution module 112 further causes the processing unit 202 to generate the digital twin 126 for the controller device 124 based on the analysis of the hardware ontology of the controller device 124. In one example, the digital twin 126 of the controller device 124 is generated based on an analysis of the dynamic ontology-based knowledge graph and the static ontology based knowledge graph. The digital twin 126 is generated further based on the input knowledge graph, the output knowledge graph, and the input-output correspondence knowledge graph generated by the processing unit 202. In one example, the digital twin 126 of the controller device 124 is a computer model of the controller device 124, which is configured to simulate outputs which is likely to be generated by the controller device 124 in a future scan cycle of execution of the engineering program in the controller device 124.

The diagnostic and resolution module 112 further causes the processing unit 202 to execute the engineering program in the generated digital twin 126, using the simulated plurality of input signals as input. In other words, the processing unit 202 causes the digital twin 126 to simulate an execution of the engineering program by the controller device 124, as if the simulated plurality of input signals are fed to the controller device 124 during execution of the engineering program.

The diagnostic and resolution module 112 further causes the processing unit 202 to receive from the digital twin 126 of the controller device 124, one or more program execution parameters, during execution of the engineering program by the digital twin 126. The diagnostic and resolution module 112 further causes the processing unit 202 to analyze the one or more program execution parameters received from the digital twin 126. The diagnostic and resolution module 112 further causes the processing unit 202 to detect an occurrence of an error state in the digital twin 126 during a specific scan cycle of execution of the engineering program. The diagnostic and resolution module 112 further causes the processing unit 202 to predict an occurrence of an error state in the controller device 124 based on execution of the engineering program in the digital twin 126 of the controller device 124. The error state occurs in the controller device 124 at the future scan cycle of execution of the engineering program by the controller device 124.

The diagnostic and resolution module 112 further causes the processing unit 202 to analyze the engineering program and the predicted error state of the controller device 124. The diagnostic and resolution module 112 further causes the processing unit 202 to determine one or more programmatical errors in the engineering program based on an analysis of the predicted error state in the controller device 124. Examples of the one or more programmatical errors includes, but is not limited to syntax errors, semantic errors, logical errors, interface errors, and resource errors.

In one example, the diagnostic and resolution module 112 further causes the processing unit 202 to map the predicted error state to one or more programming blocks of the engineering program. The diagnostic and resolution module 112 further causes the processing unit 202 to determine a type of the predicted error state based on an analysis of the predicted error state. Examples of the type of the one or more programmatical errors includes, but is not limited to a syntax error type, a semantic error type, a logical error type, an interface error type, and a resource error type. The diagnostic and resolution module 112 further causes the processing unit 202 to determine one or more programmatical errors in the engineering program based on an analysis of the predicted error state. In one example, the one or more programmatical errors are determined based on an application of an artificial intelligence model on the predicted error state and the engineering program. In one example, the artificial intelligence model is a convoluted neural network based artificial intelligence model. In another example, the one or more programmatical errors are determined based on the mapping of the predicted error state to the one or more programming blocks of the engineering program.

The diagnostic and resolution module 112 further causes the processing unit 202 to apply the artificial intelligence model on the engineering program to eradicate the determined one or more programmatical errors from the engineering program. The diagnostic and resolution module 112 further causes the processing unit 202 to generate a corrected engineering program based on the application of the artificial intelligence model on the engineering program. The artificial intelligence model is trained to eradicate the determined one or more programmatical errors from the engineering program.

The communication interface 208 is configured for establishing communication sessions between the one or more client devices 120A-N, the engineering system 102, and the controller device 124. The communication interface 208 allows the one or more engineering applications running on the client devices 120A-N to import/export engineering programs into the controller device 124. In an embodiment, the communication interface 208 interacts with the interface at the one or more client devices 120A-N for allowing the engineers to access the engineering programs associated with an engineering project file and perform one or more actions on the engineering programs stored in the engineering system 102.

The input-output unit 210 may include input devices a keypad, touch-sensitive display, camera (such as a camera receiving gesture-based inputs), etc. capable of receiving one or more input signals, such as user commands to process engineering project file. Also, the input-output unit 210 may be a display unit for displaying a graphical user interface which visualizes the behavior model associated with the modified engineering programs and also displays the status information associated with each set of actions performed on the graphical user interface. The set of actions may include execution of predefined tests, download, compile and deploy of graphical programs. The bus 214 acts as interconnect between the processor 202, the memory 204, and the input-output unit 210.

The network interface 212 may be configured to handle network connectivity, bandwidth and network traffic between the engineering system 102, client devices 120A-N and the technical installation 106.

Those of ordinary skilled in the conventional art will appreciate that the hardware depicted in FIG. 2 may vary for particular implementations. For example, other peripheral devices such as an optical disk drive and the like, Local Area Network (LAN), Wide Area Network (WAN), Wireless (e.g., Wi-Fi) adapter, graphics adapter, disk controller, input/output (I/O) adapter also may be used in addition or in place of the hardware depicted. The depicted example is provided for the purpose of explanation only and is not meant to imply architectural limitations with respect to the present disclosure.

Those skilled in the conventional art will recognize that, for simplicity and clarity, the full structure and operation of all data processing systems suitable for use with the present disclosure is not being depicted or described herein. Instead, only so much of an engineering system 102 as is unique to the present disclosure or necessary for an understanding of the present disclosure is depicted and described. The remainder of the construction and operation of the engineering system 102 may conform to any of the various current implementation and practices known in the conventional art.

Figure 3:
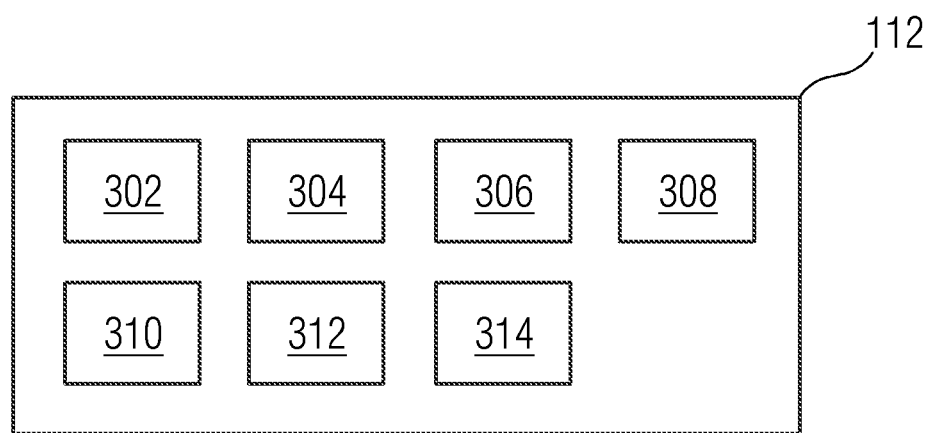
FIG. 3 is a block diagram of an diagnostics and resolution module, such as those shown in FIG. 2, in which an embodiment of the present disclosure can be implemented.
Figure 4A:
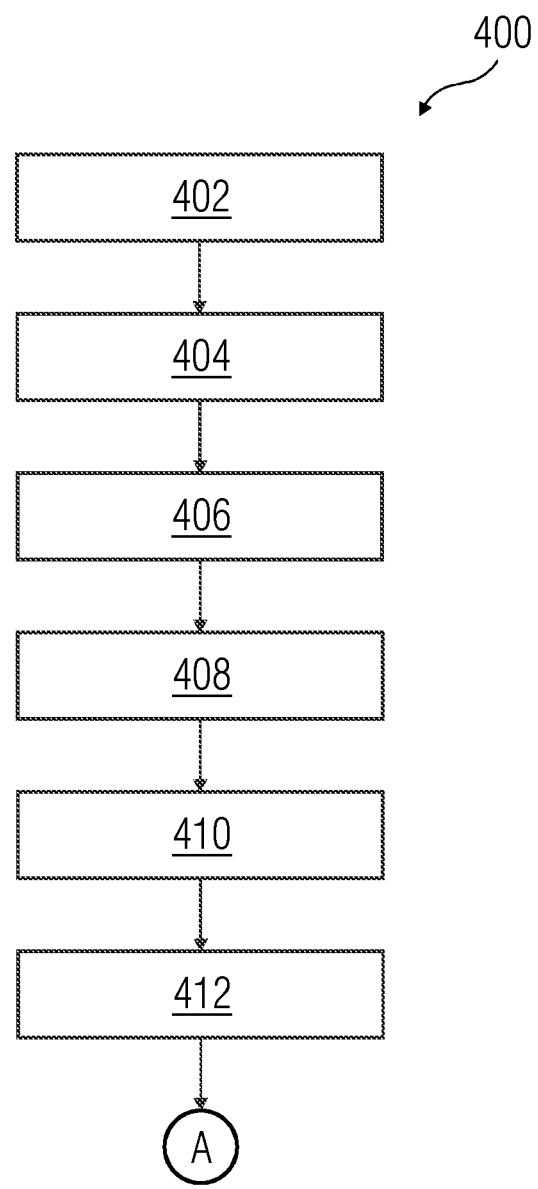
FIG. 4A is a process flowchart illustrating an exemplary method of generating engineering programs in an engineering system, according to an embodiment of the present disclosure.
Figure 4B:
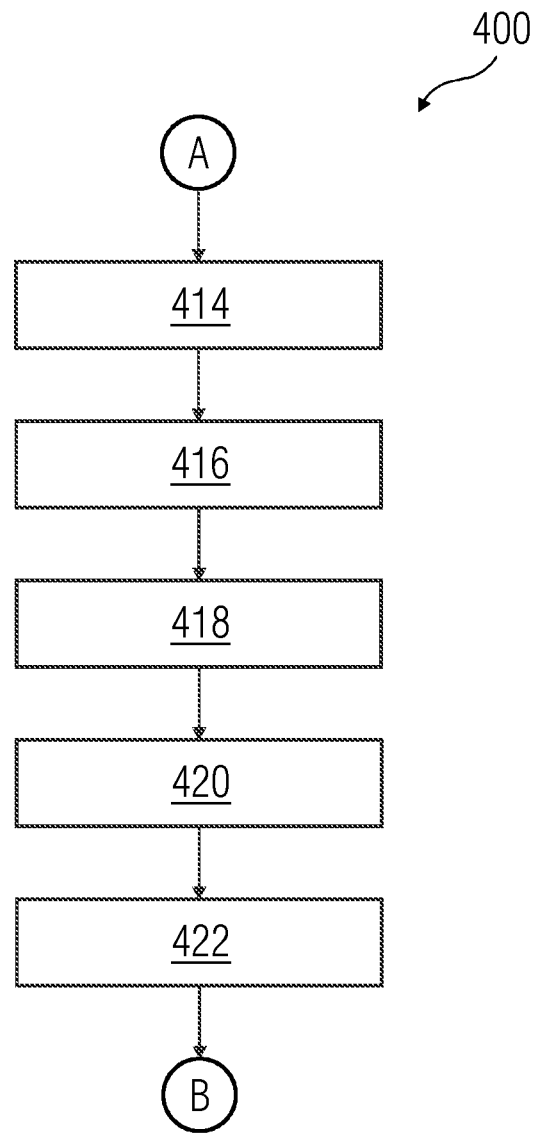
FIG. 4B is a process flowchart illustrating an exemplary method of generating engineering programs in an engineering system, according to an embodiment of the present disclosure.
Figure 4C:
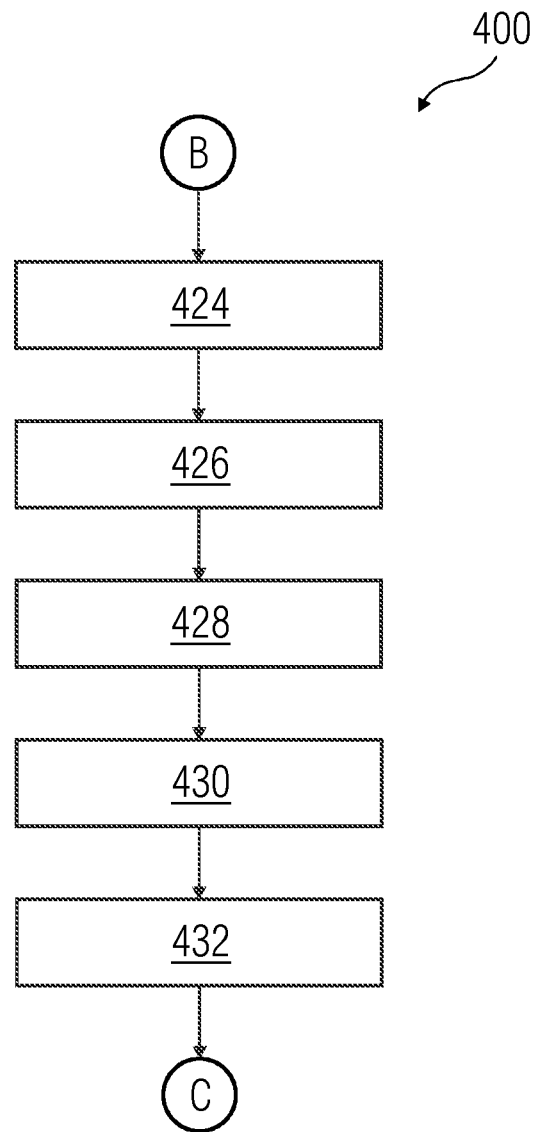
FIG. 4C is a process flowchart illustrating an exemplary method of generating engineering programs in an engineering system, according to an embodiment of the present disclosure.
Figure 4D:
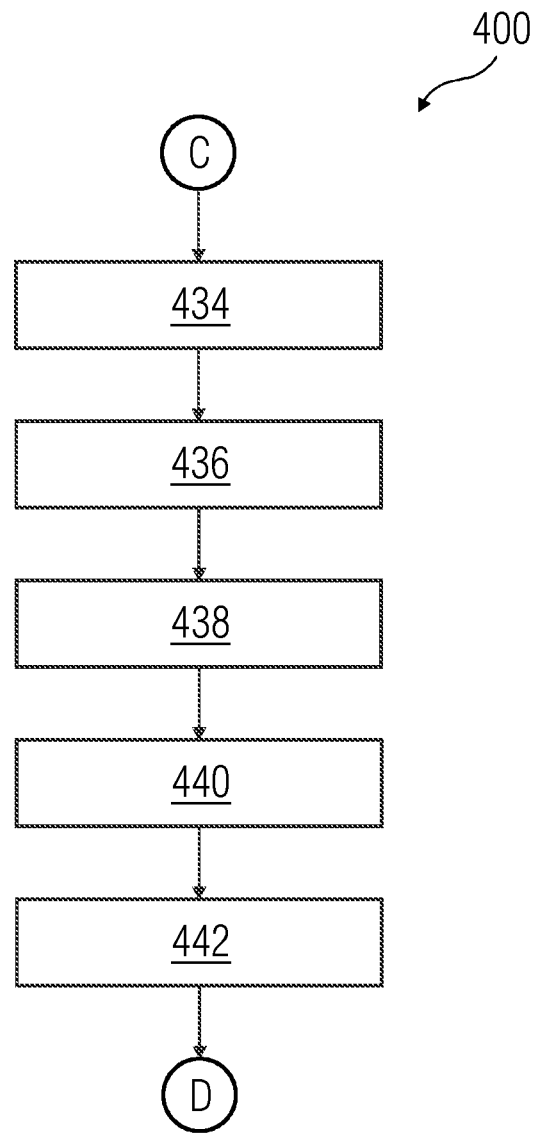
FIG. 4D is a process flowchart illustrating an exemplary method of generating engineering programs in an engineering system, according to an embodiment of the present disclosure.

FIG. 3 is a block diagram of the diagnostics and resolution module 112, such as those shown in FIG. 2, in which an embodiment of the present disclosure can be implemented. In FIG. 3, the diagnostics and resolution module 112 comprises a request handler module 302, a digital twin generation module 304, an analysis module 306, a modifier module 308, an engineering object database 310, a validation module 312 and a deployment module 314. FIG. 3 is explained in conjunction with FIG. 1 and FIG. 2.

The request handler module 302 is configured for receiving the request to eradicate the programmatical errors from the engineering program associated with the technical installation 106. For example, the request is received from one of the one or more users external to the industrial environment 100 via a network. In alternative embodiment, the request is received from the one or the one or more client devices 120A-N via the network. The request handler module 302 is further configured to determine the set of programming block associated with the industrial domain from the plurality of programming blocks associated with the set of industrial domains.

The digital twin generation module 304 is configured for generating the digital twin 126 of the controller device 124. The digital twin generation module 304 is configured to generate the hardware ontology associated with the controller device 124, based on the static ontology-based knowledge graph and the dynamic ontology-based knowledge graph. The digital twin generation module 304 is configured to generate the digital twin of the controller device 124 from the hardware ontology of the controller device 124.

The analysis module 306 is configured for analyzing the first set of program execution parameters to predict the error state of the controller device in a future scan cycle of execution of the engineering program. Specifically, the analysis module 306 is configured for retrieving the first set of program execution parameters from the controller device 124.

The modifier module 308 is configured for applying an artificial intelligence model on the engineering program to eradicate the programmatical errors from the engineering program. The set of programming blocks is modified based on the analysis of the predicted error state of the controller device. The modifications comprise any changes such as addition, deletion, update, replacement or revision of one or more variables, code lines, classes, functions, or comments in the engineering program to eradicate the programmatical errors in the engineering program.

The engineering object database 310 is configured for generating an engineering object library comprising the generated object behavior models, one or more engineering objects 108A-N, physical connections between the one or more engineering objects 108A-N, and a plurality of parameter values associated with the one or more engineering objects 108A-N and the physical connections. The engineering object database 310 is configured for continuously updating the engineering object library with updated versions of the engineering programs. Also, the engineering object database 310 is configured for maintaining the engineering object library in an ontology schema.

The validation module 312 is configured to initiate concurrent execution of the engineering program in the controller device 124 and the digital twin 126 of the controller device 124. The validation module 312 is configured to simulate execution of the generated engineering program by the controller device 124 of the technical installation 106 in a simulation environment by executing the engineering program on the generated digital twin 126. The validation module 312 is configured to determine that the generated engineering program is valid, based on a result of the simulated execution of the engineering program.

The deployment module 314 is configured for deploying the engineering program in real-time onto the controller device 124 installed in the technical installation 106 based on the validation. The generated engineering program is only deployed onto the one or more engineering objects 108A-N after the determination that the generated engineering program is valid.

FIGS. 4A-E are a process flowchart illustrating an exemplary method 400 of eradicating programmatical errors from an engineering program, according to an embodiment of the present disclosure.

At step 402, a plurality of input-output signals associated with a controller device 124 are captured by the processing unit 202. The plurality of input-output signals comprises a plurality of input signals and a plurality of output signals. The plurality of input-output signals comprises signals which are transmitted or received by the controller device 124 during a current scan cycle of execution of the engineering program by the controller device 124.

At step 404, the plurality of input-output signals are analyzed by the processing unit 202 to generate an input knowledge graph, an output knowledge graph, and an input-output correspondence knowledge graph. The input knowledge graph comprises information about relationships between the input signals received by the controller device 124 in a plurality of scan cycles of execution of the engineering program in the controller device 124. The processing unit 202 is configured to query the input knowledge graph to predict input signals which are likely to be received by the controller device 124 at least one scan cycle of the plurality of scan cycles of execution of the engineering program in the controller device 124.

The output knowledge graph comprises information about relationships between the output signals transmitted by the controller device 124 in the plurality of scan cycles of execution of the engineering program in the controller device 124. The processing unit 202 is configured to query the output knowledge graph to predict output signals which are likely to be received by the controller device 124 at least one scan cycle of the plurality of scan cycles of execution of the engineering program in the controller device 124. The input output correspondence knowledge graph comprises information about relationships between the input signals received by and the output signals transmitted by the controller device 124 in the plurality of scan cycles of execution of the engineering program in the controller device 124. The processing unit 202 is configured to query the output knowledge graph to predict an output signal which are likely to be transmitted by the controller device 124 for a given input signal received by the controller device 124.

At step 406, a plurality of input signals which are predicted to be received by the controller device 124 during a future scan cycle of execution of the engineering program, is simulated by the processing unit 202. The plurality of simulated input signals are simulated based on an analysis of the captured plurality of input-output signals. In one example, the plurality of input signals are simulated by the processing unit 202 by querying the input knowledge graph, the output knowledge graph and the input-output knowledge graph generated from the captured plurality of input-output signals.

At step 408, a first set of program execution parameters are received by the processing unit 202, from the controller device 124. The first set of program execution parameters comprises information about internal functioning of the controller device 124, during execution of the engineering program in the current scan cycle. For example, the first set of program execution parameters comprises runtime information such as information about memory fragmentation, scan cycle nature, system resource utilization, and memory utilization of the controller device 124 during the current scan cycle of execution of the engineering program.

At step 410, the captured plurality of input-output signals, the engineering program and the first set of program execution parameters of the controller device 124 are analyzed by the processing unit 202.

At step 412, a plurality of variations in the first set of program execution parameters when the controller device executes each programming block of the plurality of programming blocks of the engineering program, are determined by the processing unit 202.

At step 414, a dynamic ontology-based knowledge graph is generated by the processing unit 202 based on the analysis. The dynamic ontology-based knowledge graph comprises relationship between the plurality of programming blocks of the engineering program, and the first set of program execution parameters of the controller device 124 during execution of each of the plurality of programming blocks of the engineering program. The dynamic ontology-based knowledge graph further comprises information about relationship between variations in the first set of program execution parameters and the captured plurality of input-output signals. In one example, the first set of program execution parameters comprises information about the a plurality of scan cycles of execution of the engineering program. In such a case, the dynamic ontology-based knowledge graph comprises a scan cycle ontology. The scan cycle ontology comprises information about time taken for each scan cycle in the plurality of scan cycles. The scan cycle ontology further comprises information about a total number of programming blocks scanned during each scan cycle of the plurality of scan cycles. The scan cycle ontology further comprises information about a total number of broken/unsuccessful scan cycles in the plurality of scan cycles.

The first set of program execution parameters further comprises information about resource utilization, and information about memory fragmentation. In such a case, the static ontology-based knowledge graph comprises information about memory fragmentation ontology and system resource utilization ontology. Examples of information in the system resource utilization ontology includes, but is not limited to, information related to frequency of system function calls. Examples of information in the memory fragmentation ontology includes, but is not limited to, information related to work memory utilization and load memory utilization in the controller device 124.

At step 416, information associated with hardware configuration of the controller device 124 is received by the processing unit 202. Information associated with the hardware configuration of the controller device 124 comprises information about firmware, input/output instruction set, memory resources, processing power resources, clock speed, a model number and a manufacturer details of the controller device 124.

At step 418, information associated with the hardware configuration of the controller device 124 is analyzed by the processing unit 202. At step 420, a static ontology-based knowledge graph based on the analysis of the information about the hardware configuration is generated by the processing unit 202. The static ontology-based knowledge graph comprises information about the one or more hardware configuration related information associated with the controller device 124.

At step 422, a hardware ontology for the controller device 124 is generated by the processing unit 202 based on the static ontology-based knowledge graph and the dynamic ontology based knowledge graph. The hardware ontology of the controller device 124 comprises a two-dimensional knowledge graph comprising the static ontology-based knowledge graph and the dynamic ontology-based knowledge graph.

At step 424, a plurality of program execution parameters of the controller device 124 during execution of each programming block of the engineering program in a plurality of scan cycles, is received by the processing unit 202. The plurality of program execution parameters of the controller device 124 during execution of each of the plurality of scan cycles, are analyzed by the processing unit 202.

At step 426, a set of successful scan cycles and a set of unsuccessful scan cycles are determined by the processing unit 202, from the plurality of scan cycles. The set of successful scan cycles and the set of unsuccessful scan cycles are determined based on the analysis of the received plurality of program execution parameters.

At step 428, a hardware ontology-based knowledge graph is generated by the processing unit 202 based on an analysis of information associated with the set of successful scan cycles and the set of unsuccessful scan cycles.

At step 430, a digital twin 126 for the controller device 124 is generated by the processing unit 202 based on the analysis of the hardware ontology of the controller device 124. In one example, the digital twin 126 of the controller device 124 is generated based on an analysis of the dynamic ontology-based knowledge graph and the static ontology-based knowledge graph. The digital twin 126 is generated further based on the input knowledge graph, the output knowledge graph, and the input-output correspondence knowledge graph generated by the processing unit 202. In one example, the digital twin 126 of the controller device 124 is a computer model of the controller device 124, which is simulate outputs which is likely to be generated by the controller device 124, when the controller device 124 executes the engineering program in the plurality of scan cycles.

At step 432, execution of the engineering program in the generated digital twin 126 is initiated by the processing unit 202. The engineering program is executed using the simulated plurality of input signals as input. In other words, the processing unit 202 causes the digital twin 126 to simulate an execution of the engineering program by the controller device 124, as if the simulated plurality of input signals are fed to the controller device 124 during execution of the engineering program.

At step 434, the processing unit 202 receives from the digital twin 126 of the controller device 124, one or more program execution parameters from the digital twin 126, during execution of the engineering program by the digital twin 126. At step 436, the one or more program execution parameters received from the digital twin 126 are analyzed by the processing unit 202.

At step 438, an occurrence of an error state in the digital twin 126 is detected by the processing unit 202 during a specific scan cycle of execution of the engineering program. At step 440 an occurrence of an error state in the controller device 124 is predicted by the processing unit 202 based on execution of the engineering program in the digital twin of the controller device 124. The error state occurs in the controller device 124 at a future scan cycle of execution of the engineering program by the controller device 124.

At step 442, the engineering program and the predicted error state of the controller device 124 is analyzed by the processing unit 202.

At step 444, one or more programmatical errors in the engineering program are analyzed by the processing unit 202 based on an analysis of the predicted error state in the controller device 124. Examples of the one or more programmatical errors includes, but is not limited to syntax errors, semantic errors, logical errors, interface errors, and resource errors.

At step 446, the predicted error state is mapped by the processing unit 202 to one or more programming blocks of the engineering program. At step 448, a type of the predicted error state is determined by the processing unit 202 based on an analysis of the predicted error state. In one example, the one or more programmatical errors in the engineering program are determined by the processing unit 202 based on an analysis of the predicted error state. In one example, the one or more programmatical errors are determined based on an application of an artificial intelligence model on the predicted error state and the engineering program. In one example, the artificial intelligence model is a convoluted neural network based artificial intelligence model. In another example, the one or more programmatical errors are determined based on the mapping of the predicted error state to the one or more programming blocks of the engineering program.

At step 450, the artificial intelligence model is applied by the processing unit 202 on the engineering program to eradicate the determined one or more programmatical errors from the engineering program. At step 452, a corrected engineering program is generated by the processing unit 202 based on the application of the artificial intelligence model on the engineering program. The artificial intelligence model is trained to eradicate the determined one or more programmatical errors from the engineering program.

At step 454, the corrected engineering program is displayed by the processing unit 202 to the user via the display device. At step 456, a plurality of review comments about the corrected engineering program is received by the processing unit 202, from the user.

Figure 5A:
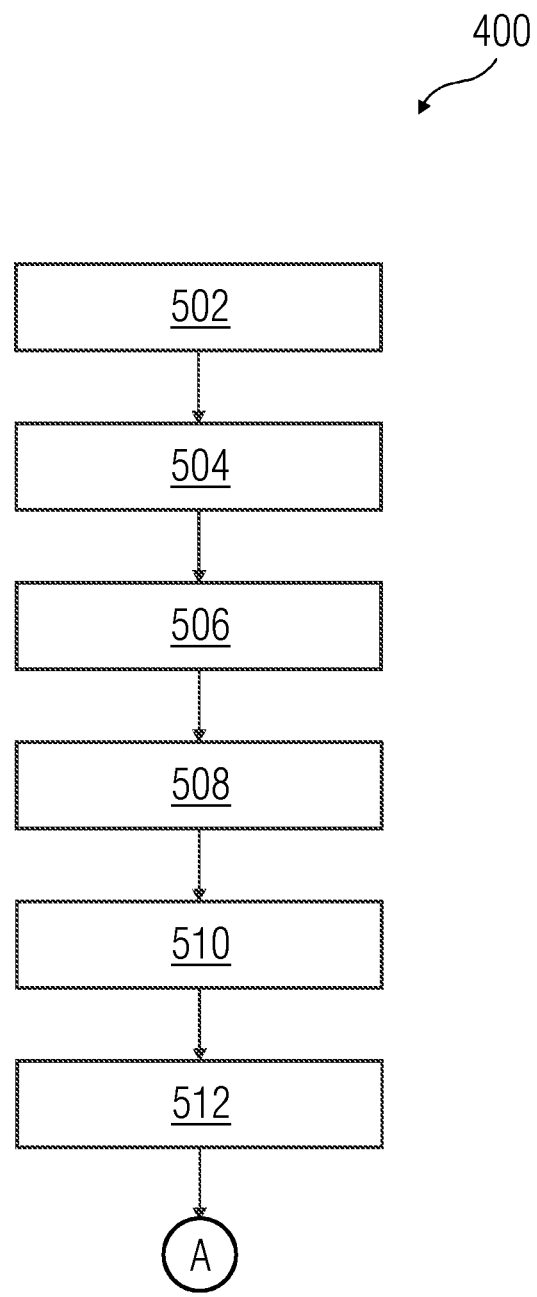
FIG. 5A is a process flowchart illustrating an exemplary method of training an artificial intelligence model to eradicate programmatical errors in the engineering program.
Figure 5B:
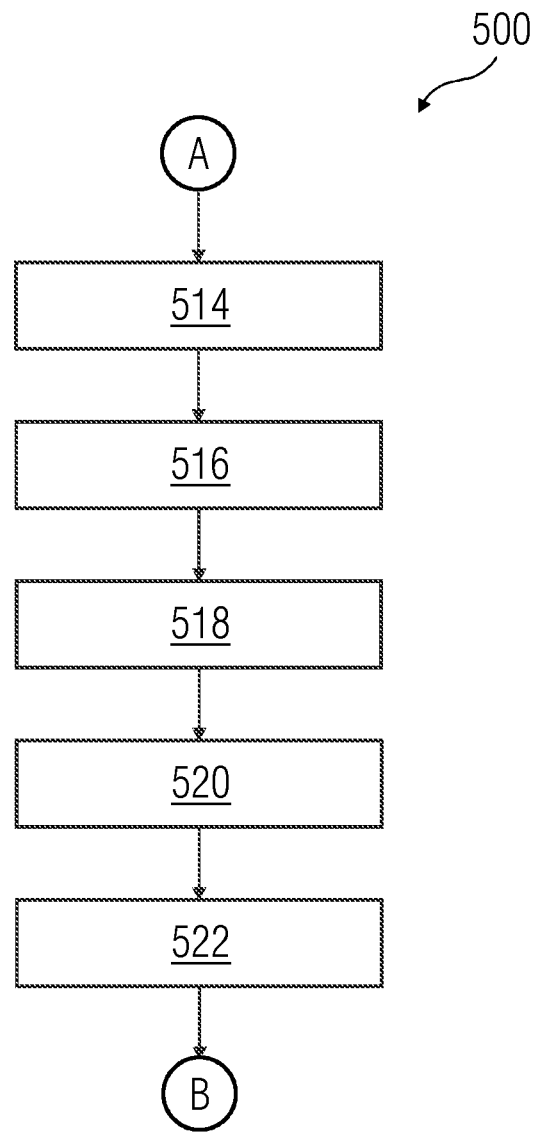
FIG. 5B is a process flowchart illustrating an exemplary method of training an artificial intelligence model to eradicate programmatical errors in the engineering program.
Figure 5C:
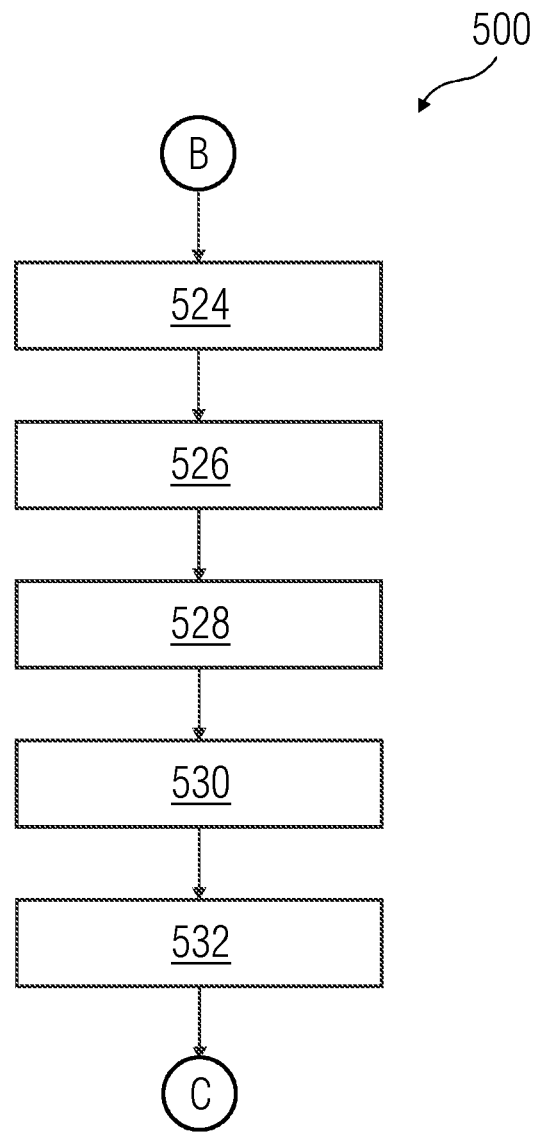
FIG. 5C is a process flowchart illustrating an exemplary method of training an artificial intelligence model to eradicate programmatical errors in the engineering program.

FIG. 5B is a process flowchart illustrating an exemplary method of training an artificial intelligence model to eradicate programmatical errors in an engineering program. FIG. 5 is explained in conjunction with terminology used in FIGS. 1 to 4.

At step 502, concurrent execution of the engineering program, is initiated by the processing unit 202 in the controller device 124 and the digital twin 126, using input signals from the captured plurality of input-output signals.

In other words, the controller device 124 and the digital twin 126 of the controller device 124 executes the engineering program simultaneously.

At step 504, the first set of program execution parameters are received by the processing unit 202 from the controller device 124. At step 506, the first set of program execution parameters are analyzed by the processing unit 202.

At step 508, it is determined by the processing unit 202 that the controller device 124 in the error state based on an analysis of the plurality of program execution parameters. In one example, the processing unit 202 is configured to determine the error state by detecting a value of one or more values of the first set of program execution parameters. For example, the first set of program execution parameters comprise information about memory resource consumption percentage associated with the controller device 124. The memory resource consumption percentage comprises information about a percentage of internal memory utilized by the controller device 124 during each scan cycle of execution of the engineering program. In such a case, the processing unit 202 is configured to determine that the controller device 124 is in the error state, when the memory resource utilization percentage reaches 100 percent.

At step 510, a set of programmatical errors are determined by the processing unit 202 in each programming block of the engineering program based on an analysis of the error state. The set of programmatical errors in each programming block is determined by the processing unit 202, by analyzing a plurality of variations in the first set of program execution parameters while the controller device 124 executes the respective programming block of the engineering program.

At step 512, a cause ontology-based knowledge graph is generated by the processing unit 202 based on an analysis of the determined set of programmatical errors, the received first set of program execution parameters, and the plurality of programming blocks of the engineering program. The cause ontology-based knowledge graph comprises information about a relationship between the set of programmatical errors in the engineering program and the error state of the controller device 124. In other words, the cause ontology-based knowledge graph comprises information about the set of programmatical errors in the engineering program and a type of the error state caused by each of the set of programmatical errors.

At step 514, the generated cause ontology-based knowledge graph is analyzed by the processing unit 202 to train the artificial intelligence model which is trained determine the one or more programmatical errors which causes the error state in the controller device 124.

At step 516, information associated with the set of programmatical errors is displayed by the processing unit 202 to a user, via a display device. Examples of the display device includes, but is not limited to, a human machine interface such as a liquid crystal display screen.

At step 518, a plurality of modifications to the engineering program are received by the processing unit 202, from the user. The user may enter the plurality of modifications to the engineering program via the human machine interface such as a keyboard or a mouse. The user may enter the plurality of modifications to eliminate the determined set of programmatical errors in the engineering program.

At step 520, the engineering program is modified by the processing unit 202 by applying the received plurality of modifications in the engineering program, to generate a modified engineering program.

At step 522, concurrent execution of the modified engineering program in the controller device 124 and the digital twin of the controller device 124, is initiated by the processing unit 202. The captured plurality of input-output signals are fed as input into the controller device 124 and the digital twin 126 during the execution of the modified engineering program.

At step 524, a second set of program execution parameters are received by the processing unit 202 from the controller device 124 and the digital twin 126. The second set of program execution parameters comprises information about internal functioning of the controller device 124 and the digital twin 126, during execution of the modified engineering program in the controller device 124 and the digital twin 126 of the controller device 124.

The processing unit 202 is further configured to compare the first set of program execution parameters with the second set of program execution parameters. At step 526, an improvement in the second set of program execution parameters as compared with the first set of program execution parameters, is determined by the processing unit 202, based on the comparison. In one example, the memory resource utilization percentage of the second set of program execution parameters may be lesser than the memory resource utilization percentage of the first set of program execution parameters, for execution of an corresponding portion of the engineering program and the modified engineering program. In such a case, the processing unit 202 is configured to determine that the second set of program execution parameters has improved as compared to the first set of program execution parameters.

At step 526, a resolution ontology-based knowledge graph is generated by the processing unit 202 based on an analysis of the determined set of programmatical errors, the received plurality of modifications, the first set of program execution parameters and the second set of program execution parameters. The resolution ontology-based knowledge graph comprises information about relationship between the determined set of programmatical errors and the plurality of modifications performed by the user to eradicate the determined set of programmatical errors from the engineering program.

At step 528, an effect ontology-based knowledge graph is generated by the processing unit 202 based on the plurality of modifications and a result of the comparison between the first set of program execution parameters and the second set of program execution parameters.

At step 530, the artificial intelligence model is trained by the processing unit 202 to determine and eradicate the one or more programmatical errors from the engineering program, using the cause ontology-based knowledge graph, the resolution ontology-based knowledge graph, and the effect ontology-based knowledge graph.

At step 532, a set of modifications for the corrected engineering program, is determined by the processing unit 202 based on an analysis of the plurality of review comments. The processing unit 202 is further configured to retrain the artificial intelligence model based on the determined set of modifications.

At step 534, a first set of output signals is received by the processing unit 202, from the controller device 124, and a second set of output signals is received by the processing unit 202, from the digital twin 126. The processing unit 202 is further configured to compare the first set of output signals and the second set of output signals. At step 536, a plurality of differences between the first set of output signals and the second set of output signals is determined by the processing unit 202 based on the comparison. At step 538, the one or more programmatical errors is determined in the engineering program based on an analysis of the plurality of differences.

The present disclosure can take a form of a computer program product (non-transitory computer readable storage medium having instructions, which when executed by a processor, perform actions) comprising program modules accessible from computer-usable or computer-readable medium storing program code for use by or in connection with one or more computers, processors, or instruction execution system. For the purpose of this description, a computer-usable or computer-readable medium can be any apparatus that can contain, store, communicate, propagate, or transport the program for use by or in connection with the instruction execution system, apparatus, or device. The medium can be electronic, magnetic, optical, electromagnetic, infrared, or semiconductor system (or apparatus or device) or a propagation mediums in and of themselves as signal carriers are not included in the definition of physical computer-readable medium include a semiconductor or solid state memory, magnetic tape, a removable computer diskette, random access memory (RAM), a read only memory (ROM), a rigid magnetic disk and optical disk such as compact disk read-only memory (CD-ROM), compact disk read/write, and DVD. Both processors and program code for implementing each aspect of the technology can be centralized or distributed (or a combination thereof) as known to those skilled in the conventional art.

Although the present invention has been disclosed in the form of embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method of eradicating programmatical errors in engineering programs of a controller device, the method comprising:
    capturing, by a processing unit, a plurality of input-output signals associated with a controller device, wherein the plurality of input-output signals comprises signals which are transmitted or received by the controller device during a current scan cycle of execution, of an engineering program, by the controller device;
    simulating, by the processing unit, a plurality of input signals which are predicted to be received by the controller device during a future scan cycle of execution of the engineering program, wherein the plurality of simulated input signals are simulated based on an analysis of the captured plurality of input-output signals;
    predicting, by the processing unit, an error state in the controller device in the future scan cycle, by execution of the engineering program in a digital twin of the controller device, wherein the engineering program is executed in the digital twin using the simulated plurality of input signals as input;
    determining, by the processing unit, one or more programmatical errors in the engineering program based on an analysis of the predicted error state in the controller device; and
    generating, by the processing unit, a corrected engineering program by application of an Artificial intelligence model on the engineering program, wherein the Artificial intelligence model is configured to eradicate the determined one or more programmatical errors from the engineering program.

2. The method according to claim 1, wherein the Artificial intelligence model is trained by:
    initiating, by the processing unit, concurrent execution of the engineering program, in the controller device and the digital twin, using input signals from the captured plurality of input-output signals;
    receiving, by the processing unit, a first set of program execution parameters from the controller device, wherein the first set of program execution parameters comprises information about internal functioning of the controller device, during execution of the engineering program in the current scan cycle; and
    determining, by the processing unit, whether the controller device in the error state based on an analysis of the plurality of program execution parameters.

3. The method according to claim 2, wherein the Artificial intelligence model is trained further by:
    determining, by the processing unit, a set of programmatical errors in the engineering program based on an analysis of the error state; and
    generating, by the processing unit, a cause ontology-based knowledge graph from analysis of the set of programmatical errors, wherein the cause ontology-based knowledge graph comprises information about a relationship between the set of programmatical errors in the engineering program and the determined error state of the controller device.

4. The method according to claim 3, wherein the Artificial intelligence model is trained further by:
    receiving, by the processing unit, a plurality of modifications to the engineering program to generate a modified engineering program;
    initiating, by the processing unit, simultaneous execution of the modified engineering program simultaneously in the controller device and the digital twin, using the captured plurality of input-output signals;
    receiving, by the processing unit, a second set of program execution parameters from the controller device, wherein the second set of program execution parameters comprises information about internal functioning of the controller device and the digital twin, during execution of the modified engineering program by the controller device and the digital twin;
    comparing, by the processing unit, the first set of program execution parameters with the second set of program execution parameters;
    generating, by the processing unit, an effect ontology-based knowledge graph based on analysis of a result of the comparison and further based on the plurality of modifications received from the user; and
    training, by the processing unit, the artificial intelligence model based on:
        the received plurality of modifications to the engineering program,
        the cause ontology-based knowledge graph, and
        the effect ontology-based knowledge graph.

5. The method according to claim 2, wherein predicting, by the processing unit, the error state in the controller device in the future scan cycle comprises:
    analyzing, by the processing unit, the captured plurality of input-output signals, the engineering program and the first set of program execution parameters of the controller device during the execution of the first engineering program in the controller device;

generating, by the processing unit, a dynamic ontology-based knowledge graph based on the analysis, wherein the dynamic ontology-based knowledge graph comprises information about relationship between variations in the first set of program execution parameters and the captured plurality of input-output signals;

analyzing, by the processing unit, one or more hardware configuration related information associated with the controller device;

generating, by the processing unit, a static ontology-based knowledge graph based on the analysis of the one or more hardware configuration related information, wherein the static ontology-based knowledge graph comprises information about the one or more hardware configuration related information associated with the controller device;

generating, by the processing unit, the digital twin of the controller device based on an analysis of the dynamic ontology-based knowledge graph and the static ontology based knowledge graph;

executing, by the processing unit, the engineering program in the generated digital twin using the simulated plurality of input signals as input; and predicting, by the processing unit, the error state in the controller device in the future scan cycle, by the execution of the engineering program in the generated digital twin.

6. The method according to claim 1, further comprising:

receiving, by the processing unit, a plurality of program execution parameters of the controller device, wherein the plurality of program execution parameters comprises information about internal functioning of the controller device, during execution of each programming block of the engineering program in a plurality of scan cycles;

classifying, by the processing unit, the plurality of scan cycle into a set of successful scan cycles and a set of unsuccessful scan cycles, based on an analysis of the received plurality of program execution parameters of the controller device; and generating, by the processing unit, a hardware ontology-based knowledge graph based on an analysis of information associated with the set of successful scan cycles and the set of unsuccessful scan cycles.

7. The method according to claim 1, further comprising:

displaying, by the processing unit, the corrected engineering program to a user via a display device;

receiving, by the processing unit, a plurality of review comments about the corrected engineering program, from the user;

determining, by the processing unit, a plurality of modifications for the corrected engineering program, based on an analysis of the plurality of review comments; and retraining, by the processing unit, the artificial intelligence model based on the determined plurality of modifications.

8. The method according to claim 1, further comprising:

initiating, by the processing unit, concurrent execution of the engineering program in the controller device and the digital twin, using input signals from the plurality of input-output signals received by the controller device in the current scan cycle;

receiving, by the processing unit, a first set of output signals from the controller device, and a second set of output signals from the digital twin;

comparing, by the processing unit, the first set of output signals and the second set of output signals;

determining, by the processing unit, a plurality of differences between the first set of output signals and the second set of output signals, based on the comparison;

determining, by the processing unit, a plurality of programmatical errors in the engineering program based on an analysis of the plurality of differences;

generating, by the processing unit, the corrected engineering program by application of the Artificial intelligence model on the engineering program, wherein the Artificial intelligence model is trained to eradicate the determined plurality of programmatical errors from the engineering program.

9. The method according to claim 1, further comprising displaying, by the processing unit, the determined one or more programmatical errors in the engineering program, via a display device.

10. An engineering system for eradication of programmatical errors in engineering programs, wherein the engineering system comprises:

a processing unit; and a memory coupled to the processing unit, wherein the memory comprises a diagnostics and resolution module stored in the form of machine-readable instructions executable by the one or more processor(s), wherein the diagnostics and resolution module is configured to:

capture a plurality of input-output signals associated with a controller device, wherein the plurality of input-output signals comprises signals which are transmitted or received by the controller device during a current scan cycle of execution, of an engineering program, by the controller device;

simulate a plurality of input signals which are predicted to be received by the controller device during a future scan cycle of execution of the engineering program, wherein the plurality of simulated input signals are simulated based on an analysis of the captured plurality of input-output signals;

predict an error state in the controller device in the future scan cycle, by execution of the engineering program in a digital twin of the controller device, wherein the engineering program is executed in the digital twin using the simulated plurality of input signals as input;

determine one or more programmatical errors in the engineering program based on an analysis of the predicted error state in the controller device; and generate a corrected engineering program by application of an Artificial intelligence model on the engineering program, wherein the Artificial intelligence model is configured to eradicate the determined one or more programmatical errors from the engineering program.

11. A computer program product, comprising a computer readable hardware storage device having computer readable program code stored therein, said program code executable by a processor of a computer system to implement a method, having machine-readable instructions stored therein, that when executed by a processing unit, cause the processors to perform a method comprising: capturing, by a processing unit, a plurality of input-output signals associated with a controller device, wherein the plurality of input-output signals comprises signals which are transmitted or received by the controller device during a current scan cycle of execution, of an engineering program, by the controller device;

simulating, by the processing unit, a plurality of input signals which are predicted to be received by the controller device during a future scan cycle of execution of the engineering program, wherein the plurality of simulated input signals are simulated based on an analysis of the captured plurality of input-output signals;

predicting, by the processing unit, an error state in the controller device in the future scan cycle, by execution of the engineering program in a digital twin of the controller device, wherein the engineering program is executed in the digital twin using the simulated plurality of input signals as input;

determining, by the processing unit, one or more programmatical errors in the engineering program based on an analysis of the predicted error state in the controller device; and generating, by the processing unit, a corrected engineering program by application of an Artificial intelligence model on the engineering program, wherein the Artificial intelligence model is configured to eradicate the determined one or more programmatical errors from the engineering program.

\* \* \* \* \*